United States Patent
Huang

(10) Patent No.: US 11,239,423 B2
(45) Date of Patent: Feb. 1, 2022

(54) METHOD AND DEVICE FOR MODIFYING FILM DEPOSITION POSITION

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventor: Weiyun Huang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 145 days.

(21) Appl. No.: 16/643,033

(22) PCT Filed: Aug. 27, 2019

(86) PCT No.: PCT/CN2019/102797
§ 371 (c)(1),
(2) Date: Feb. 28, 2020

(87) PCT Pub. No.: WO2020/063237
PCT Pub. Date: Apr. 2, 2020

(65) Prior Publication Data
US 2021/0217959 A1     Jul. 15, 2021

(30) Foreign Application Priority Data
Sep. 28, 2018   (CN) .......................... 201811141088.3

(51) Int. Cl.
*H01L 51/56*     (2006.01)
*H01L 51/00*     (2006.01)
(Continued)

(52) U.S. Cl.
CPC ........ *H01L 51/0012* (2013.01); *C23C 14/042* (2013.01); *H01L 51/50* (2013.01);
(Continued)

(58) Field of Classification Search
None
See application file for complete search history.

(56) References Cited

U.S. PATENT DOCUMENTS 11,088,326 B2 *   8/2021   Jeong ................... H01L 23/544
2014/0158044 A1   6/2014   Han
(Continued)

FOREIGN PATENT DOCUMENTS

CN   102650819 A   8/2012
CN   103866229 A   6/2014
(Continued)

OTHER PUBLICATIONS

First Office Action and English language translation, CN Application No. 201811141088.3, dated Nov. 19, 2019, 13 pp.
Second Office Action and English language translation, CN Application No. 201811141088.3, dated Jun. 16, 2020, 10 pp.

*Primary Examiner* — Benjamin P Sandvik
(74) *Attorney, Agent, or Firm* — Myers Bigel, P.A.

(57) ABSTRACT

A method and device for modifying a film deposition position in a film deposition process with a mask component are disclosed. The mask component includes a mask frame and a mask body fixed to the mask frame. The method includes obtaining a first offset displacement between a plurality of second mark points on the mask component and a plurality of first mark points on the mask body, obtaining a second offset displacement between the plurality of third mark points on the substrate and the plurality of second mark points on the mask component, determining an actual offset displacement between an actual forming position and a preset forming position of the film, according to the first
(Continued)

offset displacement and the second offset displacement, and modifying the preset forming position of the film, according to the actual offset displacement between the actual forming position and the preset forming position of the film.

14 Claims, 8 Drawing Sheets

(51) Int. Cl.
*C23C 14/04* (2006.01)
*H01L 51/50* (2006.01)
*H01L 27/32* (2006.01)

(52) U.S. Cl.
CPC ....... *H01L 27/3211* (2013.01); *H01L 51/0011* (2013.01); *H01L 51/56* (2013.01)

(56) References Cited

U.S. PATENT DOCUMENTS

| | | | |
|---|---|---|---|
| 2014/0353598 A1* | 12/2014 | Jeong | H01L 23/544 257/40 |
| 2016/0343944 A1 | 11/2016 | Lee et al. | |
| 2017/0207390 A1 | 7/2017 | Kim et al. | |

FOREIGN PATENT DOCUMENTS

| | | |
|---|---|---|
| CN | 204714884 U | 10/2015 |
| CN | 105867066 A | 8/2016 |
| CN | 106169535 A | 11/2016 |
| CN | 106637074 A | 5/2017 |
| CN | 109285972 A | 1/2019 |
| WO | 2018/147339 A1 | 8/2018 |

\* cited by examiner ns.bashMETHOD AND DEVICE FOR MODIFYING
FILM DEPOSITION POSITION

RELATED APPLICATIONS

The present application is a 35 U.S.C. 371 national stage application of PCT International Application No. PCT/CN2019/102797, filed on Aug. 27, 2019, which claims the benefit of Chinese Patent Application No. 201811141088.3, filed on Sep. 28, 2018, the entire disclosures of which are incorporated herein by reference.

TECHNICAL FIELD

The present disclosure relates to the field of display technologies, and particularly to a method and device for modifying a film deposition position in a film deposition process with a mask component.

BACKGROUND

Currently, a Fine Metal Mask (FMM) is usually used, a light emitting material passes through opening regions of FMM and sticks on a substrate on which a Thin Film Transistor (TFT) has been formed, so as to form an Organic Light Emitting Diode (OLED) display panel.

With the continuously increase of the Pixels Per Inch (PPI, pixel density) of an OLED display panel, the requirements for the fabrication accuracy of FMM, stretching accuracy and evaporation accuracy of the light emitting material accordingly increase. In case of low accuracy or poor process stability, various defects occur.

SUMMARY

Embodiments of the present disclosure provide a method for modifying a film deposition position in a film deposition process with a mask component, wherein the mask component comprises a mask frame and a mask body fixed to the mask frame, the method comprising: obtaining a first offset displacement between a plurality of second mark points on the mask component and a plurality of first mark points on the mask body; obtaining a second offset displacement between the plurality of third mark points on the substrate and the plurality of second mark points on the mask component, wherein the plurality of third mark points are formed by the plurality of second mark points on the substrate when a film is evaporated on the substrate with the mask component; determining an actual offset displacement between an actual forming position and a preset forming position of the film, according to the first offset displacement and the second offset displacement; and modifying the preset forming position of the film, according to the actual offset displacement between the actual forming position and the preset forming position of the film.

In some embodiments, the step of obtaining the first offset displacement between the plurality of second mark points on the mask component and the plurality of first mark points on the mask body comprises: obtaining first coordinates of the plurality of first mark points on the mask body; measuring second coordinates of the plurality of second mark points on the mask component; and subtracting the first coordinates from the second coordinates, to obtain the first offset displacement between the plurality of second mark points on the mask component and the plurality of first mark points on mask body.

In some embodiments, the step of obtaining the second offset displacement between the plurality of third mark points on the substrate and the plurality of second mark points on the mask component comprises: measuring third coordinates of the plurality of third mark points on the substrate; and subtracting the second coordinates from the third coordinates, to obtain the second offset displacement between the plurality of third mark points on the substrate and the plurality of second mark points on the mask component.

In some embodiments, the step of determining the actual offset displacement between the actual forming position and the preset forming position of the film, according to the first offset displacement and the second offset displacement, comprises: adding the first offset displacement to the second offset displacement, to obtain an actual offset displacement of the plurality of third mark points; as for a first target mark point and a second target mark point of the plurality of third mark points, dividing a difference value between the actual offset displacement of the second target mark point and the first target mark point by a number of actual forming positions of the film between the first target mark point and the second target mark point to obtain a first ratio; and as for the Mth actual forming position of the film between the first target mark point and the second target mark point, adding a product of M and the first ratio to actual offset displacement of the first target mark point, to obtain the Mth actual offset displacement between the actual forming position and the preset forming position of the film, M being a positive integer larger than 0.

In some embodiments, the step of modifying the preset forming position of the film, according to the actual offset displacement between the actual forming position and the preset forming position of the film, comprises: when the actual offset displacement between the actual forming position and the preset forming, position of the film lies in a compensable range, modifying the preset forming position of the film, according to the actual offset displacement between the actual forming position and the preset forming position of the film; and when the actual offset displacement between the actual forming position and the preset forming position of the film does not lie in the compensable range, and the difference value from the maximum compensation displacement corresponding to the compensable range meets a threshold, modifying the preset forming position of the film, according to the maximum compensation displacement.

In some embodiments, the step of modifying the preset forming position of the film, according to the actual offset displacement between the actual forming position and the preset forming position of the film, comprises: determining an offset displacement of the pixel definition layer, according to the actual offset displacement between the actual forming position and the preset forming position of the film; wherein the actual offset displacement between the actual forming position and the preset forming position of the film have a same corresponding distance and a same direction as the offset displacement of the pixel definition layer; and the step of modifying the preset forming position of the film according to the maximum compensation displacement comprises: determining the offset displacement of the pixel definition layer, according to the maximum compensation displacement, wherein the maximum compensation displacement have a same corresponding distance and a same direction as the offset displacement of the pixel definition layer.

In some embodiments, the step of modifying the preset forming position of the film, according to the actual offset displacement between the actual forming position and the preset forming position of the film, comprises: determining an offset displacement of corresponding opening regions on the mask component, according to the actual offset displacement between the actual forming position and the preset forming position of the film; wherein the actual offset displacement between the actual forming position and the preset forming position of the film and the offset displacement of corresponding opening regions on the mask component have a same corresponding distance but opposite direction; and the step of modifying the preset forming position of the film according to the maximum compensation displacement comprises: determining the offset displacement of corresponding opening regions on the mask component according to the maximum compensation displacement, wherein the maximum compensation displacement and the offset displacement of corresponding opening regions on the mask component have a same corresponding distance but opposite direction.

Embodiments of the present disclosure further provide a device for modifying film deposition position in a film deposition process with a mask component, wherein the mask component comprises a mask frame and a mask body fixed to the mask frame, the device comprising: a first offset displacement obtainer, configured to obtain a first offset displacement between a plurality of second mark points on the mask component and a plurality of first mark points on the mask body; a second offset displacement obtainer, configured to obtain a second offset displacement between the plurality of third mark points on the substrate and the plurality of second mark points on the mask component, wherein the plurality of third mark points are formed on the substrate by the plurality of second mark points when a film is evaporated on the substrate with the mask component; an actual offset displacement determiner, configured to determine an actual offset displacement between the actual forming position and the preset forming position of the film, according to the first offset displacement and the second offset displacement; and a forming position modifier, configured to modify the preset forming position of the film, according to the actual offset displacement between the actual forming position and the preset forming position of the film.

In some embodiments, the first offset displacement obtainer comprises: a first coordinate sub-obtainer, configured to obtain first coordinates of the plurality of first mark points on the mask body; a second coordinate sub-measurer, configured to measure second coordinates of the plurality of second mark points on the mask component; and a first offset displacement sub-calculator, configured to subtract the first coordinates from the second coordinates, to obtain the first offset displacement between the plurality of second mark points on the mask component and the plurality of first mark points on mask body.

In some embodiments, the second offset displacement obtainer comprises: a third coordinate sub-measurer, configured to measure third coordinates of the plurality of third mark points on the substrate; and a second offset displacement sub-calculator, configured to subtract the second coordinates from the third coordinates, to obtain the second offset displacement between the plurality of third mark points on the substrate and the plurality of second mark points on the mask component.

In some embodiments, the actual offset displacement determiner comprises: a first actual offset displacement sub-calculator, configured to add the first offset displacement to the second offset displacement, to obtain an actual offset displacement of the plurality of third mark points; a first ratio sub-calculator, configured to, as for a first target mark point and a second target mark point of the plurality of third mark points, divide a difference value between the actual offset displacement of the second target mark point and the first target mark point by a number of actual forming positions of the film between the first target mark point and the second target mark point to obtain a first ratio; and a second actual offset displacement sub-calculator, configured to, as for the Mth actual forming position of the film between the first target mark point and the second target mark point, add a product of M and the first ratio to actual offset displacement of the first target mark point, to obtain the Mth actual offset displacement between the actual forming position and the preset forming position of the film, M being a positive integer larger than 0.

In some embodiments, the forming position modifier comprises: a first forming position sub-modifier, configured to, when the actual offset displacement between the actual forming position and the preset forming position of the film lies in a compensable range, modify the preset forming position of the film, according to the actual offset displacement between the actual forming position and the preset forming position of the film; and a second forming position sub-modifier, configured to, when the actual offset displacement between the actual forming position and the preset forming position of the film does not lie in the compensable range, and the difference value from the maximum compensation displacement corresponding to the compensable range meets a threshold, modify the preset forming position of the film, according to the maximum compensation displacement.

In some embodiments, the first forming position sub-modifier comprises: a first offset displacement determiner, configured to determine an offset displacement of the pixel definition layer, according to the actual offset displacement between the actual forming position and the preset forming position of the film; wherein the actual offset displacement between the actual forming position and the preset forming position of the film have a same corresponding distance and a same direction as the offset displacement of the pixel definition layer; and the second forming position sub-modifier comprises: a second offset displacement determiner, configured to determine the offset displacement of the pixel definition layer, according to the maximum compensation displacement; wherein the maximum compensation displacement have a same corresponding distance and a same direction as the offset displacement of the pixel definition layer.

In some embodiments, the first forming position sub-modifier comprises: a third offset displacement determiner, configured to determine an offset displacement of corresponding opening regions on the mask component, according to the actual offset displacement between the actual forming position and the preset forming position of the film; wherein the actual offset displacement between the actual forming position and the preset forming position of the film and the offset displacement of corresponding opening regions on the mask component have a same corresponding distance but opposite direction; and the second forming position sub-modifier comprises: a fourth offset displacement determiner, configured to determine the offset displacement of corresponding opening regions on the mask component according to the maximum compensation displacement; wherein the maximum compensation displacement and the offset displacement of corresponding opening regions on the mask component have a same corresponding distance but opposite direction.

DETAILED DESCRIPTION OF EMBODIMENTS

To make the objects, the technical solutions and the advantages of embodiments of the present disclosure more apparent, the technical solutions of the embodiments of the present disclosure will be described in detail hereinafter in conjunction with the drawings of the embodiments of the present disclosure.

Figure 1:
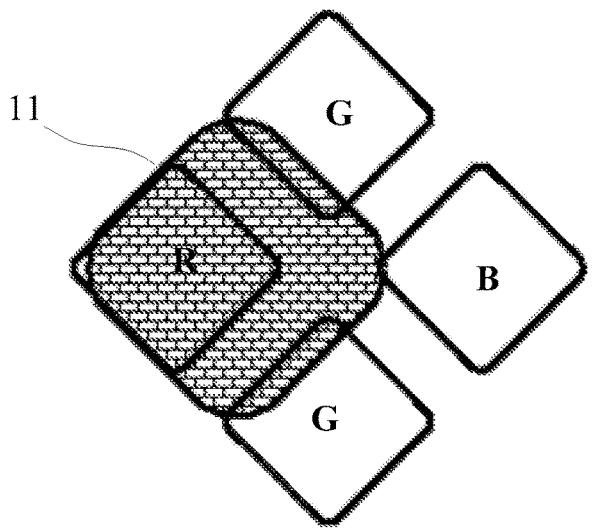
FIG. 1 is a structural view for illustrating a color mixing phenomenon in a related art.

In a process of evaporating a film by using a FMM, in case of low accuracy or poor process stability, the defect of color mixing occurs. For example, as shown in FIG. 1, R indicates a Pixel Definition Layer (PDL) opening region to which a red pixel corresponds, G indicates a PDL opening region to which a green pixel corresponds, and B indicates a PDL opening region to which a blue pixel corresponds. For example, due to a problem about evaporation accuracy, a red light emitting material 11 covers the PDL opening region for the green pixel, and this causes the color mixing phenomenon to occur.

Embodiments of the present disclosure provide a method and device for modifying a film deposition position in a film deposition process with a mask component, to solve one or more of the problems, such as low accuracy, non-uniformity (e.g., color mixing defect) which are prone to occur during evaporating a film (e.g., light emitting material) by FMM in the related art.

Figure 2:
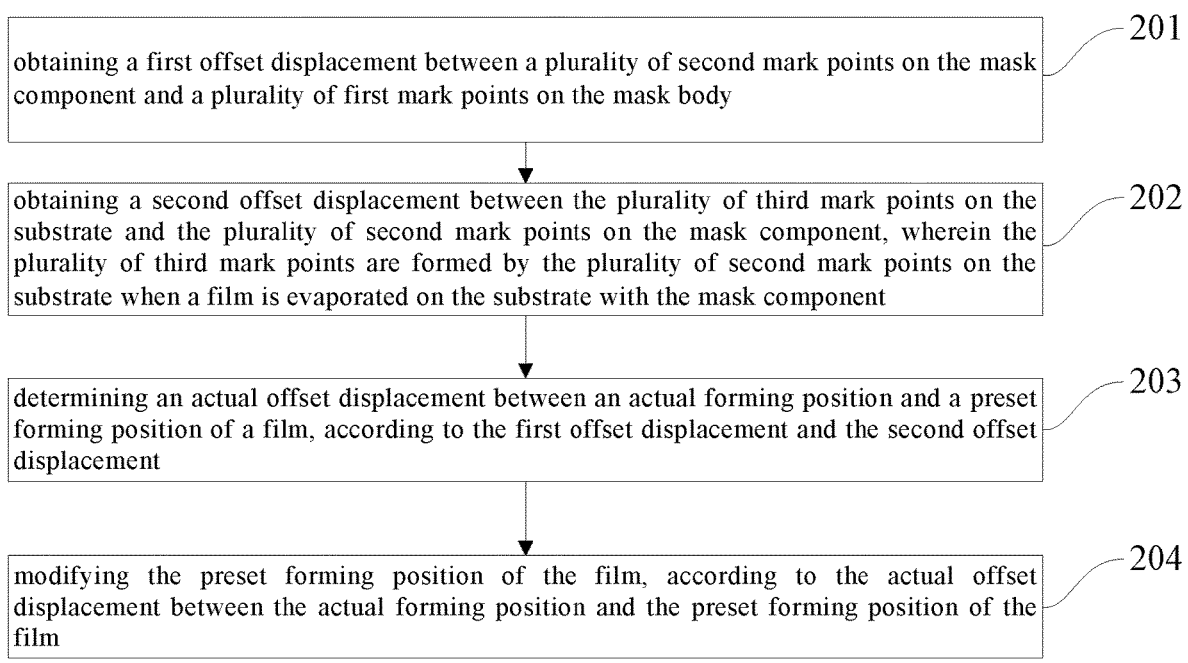
FIG. 2 is a flow chart for illustrating a method for modifying a film deposition position in a film deposition process with a mask component in an embodiment of the present disclosure.

In a method according to an exemplary embodiment of the present disclosure, reference is made to FIG. 2, which shows a flow chart for a method for modifying a film deposition position in a film deposition process with a mask component in an embodiment of the present disclosure. The mask component comprises a mask frame and a mask body fixed to the mask frame. The method comprises the following steps.

Step 201, obtaining a first offset displacement between a plurality of second mark points on the mask component and a plurality of first mark points on the mask body.

Figure 3A:
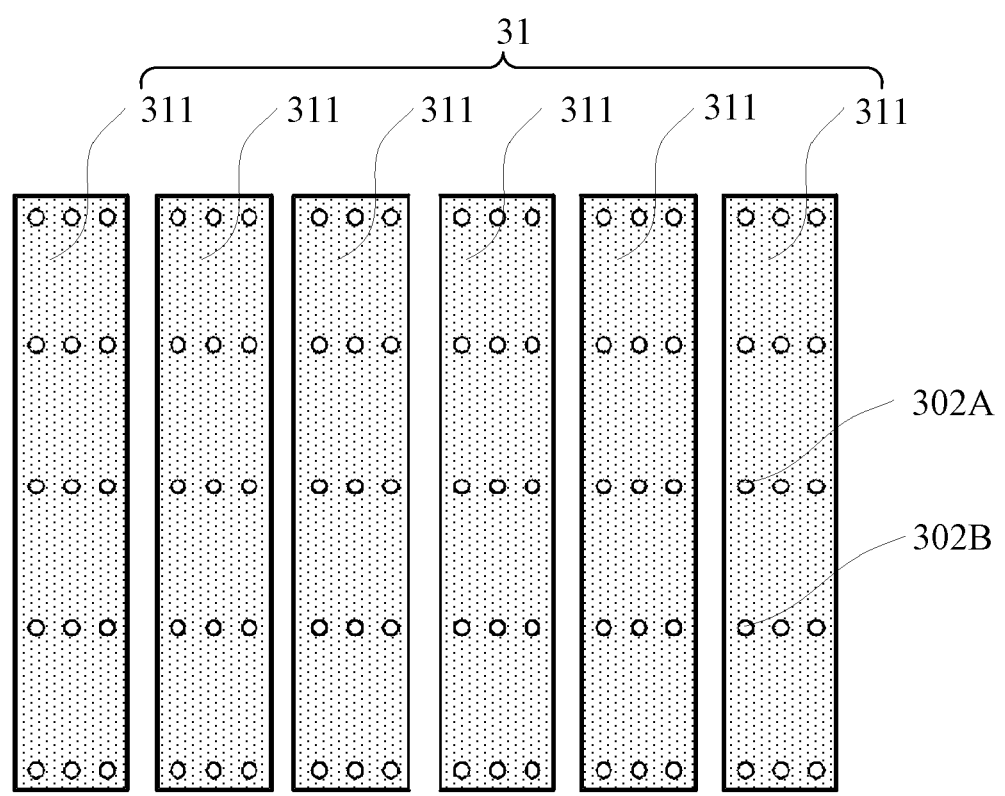
FIG. 3A is a structural view for illustrating a mask body.
Figure 3B:
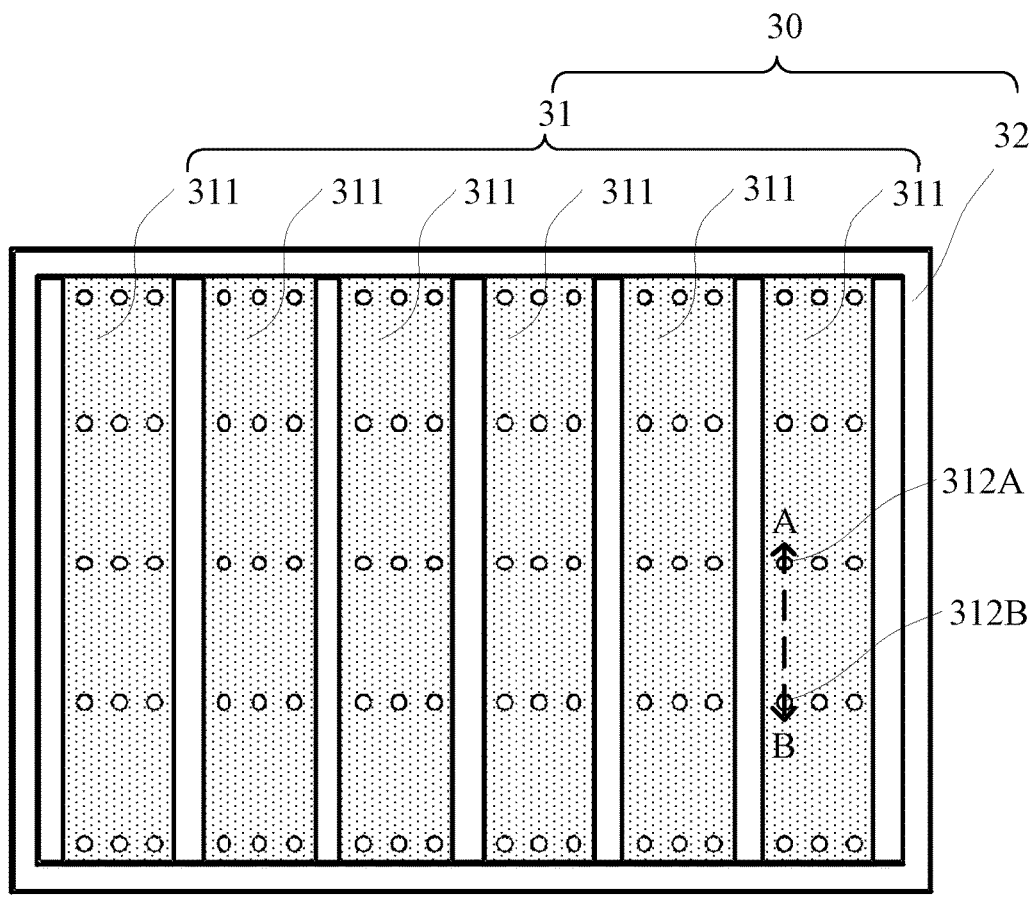
FIG. 3B is a structural view for illustrating a mask component.

Reference is made to FIG. 3A and FIG. 3B, which show structural views for the mask body and mask component.

A mask component 30 comprises a mask body 31 and a mask frame 32. During forming the mask component 30, the mask body 31 is firstly formed according to a design drawing. The mask body 31 comprises a plurality of metal strips 311. Due to process conditions, a certain slit is formed between any two metal strips 311, and this slit usually has a same width. A plurality of opening regions (not shown in FIG. 3A and FIG. 3B) and a plurality of first mark points 302A, 302B (only two of the first mark points are shown) are formed on each of the metal strips 311. A material for a film to be evaporated, for example a light emitting material, can pass through the opening regions in the metal strips 311 and is evaporated on a substrate.

The mask body 31 is a FMM. When the plurality of opening regions are formed in the metal strips 311, both a size of each of the opening regions and a gap between two neighboring opening regions affect the accuracy of the mask body 31, i.e., the fabrication accuracy of FMM.

A stretching operation is then performed. Namely, the mask body 31 as fabricated is fixed to the mask frame 32 to form the mask component 30. The mask body 31 and the mask frame 32 can be fixed by soldering. After stretching, the plurality of first mark points 302A, 302B correspondingly turn into a plurality of second mark points 312A, 312B (only two of the second mark points are shown). When the mask body 31 is fixed to the mask frame 32, due to factors like uneven fixing strength, an offset of the plurality of second mark points 312A, 312B on the mask component 30 with respect to the plurality of first mark points 302A, 302B on the mask body 31 occurs. A large offset indicates a low stretching accuracy, while a small offset indicates a high stretching accuracy. The stretching accuracy means, after the mask body 31 is fixed to the mask frame 32, the magnitude of a difference between the mask body 31 in the formed mask component 30 and the mask body 31 which is not fixed. The second mark points indicate the first mark points after stretching.

The first offset displacement of the plurality of second mark points 312A, 312B on the mask component 30 is obtained. The first offset displacement means an offset displacement between the plurality of second mark points 312A, 312B on the mask component 30 with respect to the plurality of first mark points 302A, 302B of the mask body 31.

Step 202, obtaining a second offset displacement between the plurality of third mark points on the substrate and the plurality of second mark points on the mask component, wherein the plurality of third mark points are formed by the plurality of second mark points on the substrate when a film is evaporated on the substrate with the mask component.

Figure 4A:
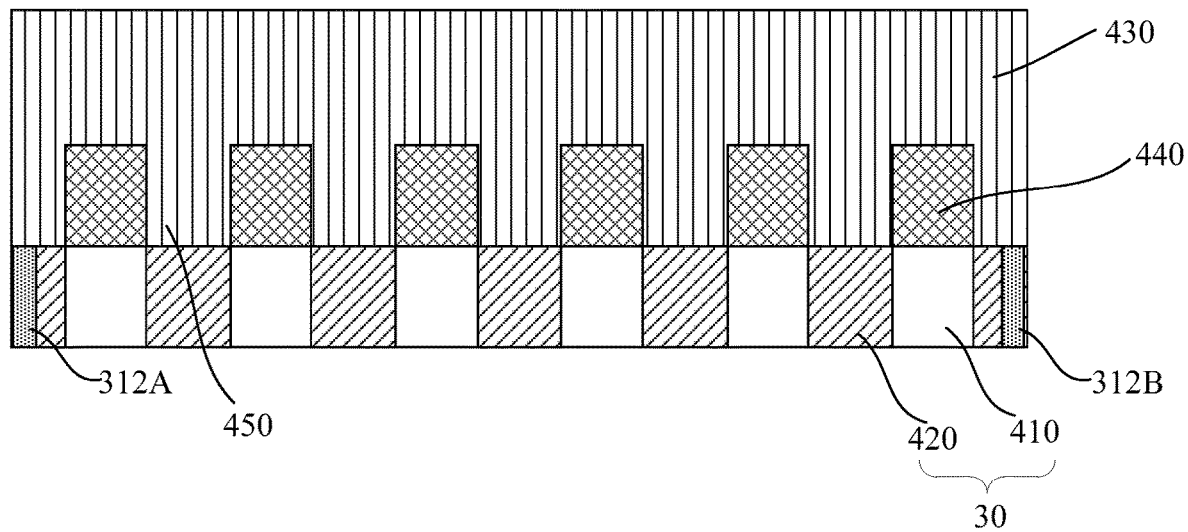
FIG. 4A is a cross-sectional view for illustrating a combined structure of the mask component and a substrate during evaporation.
Figure 4B:
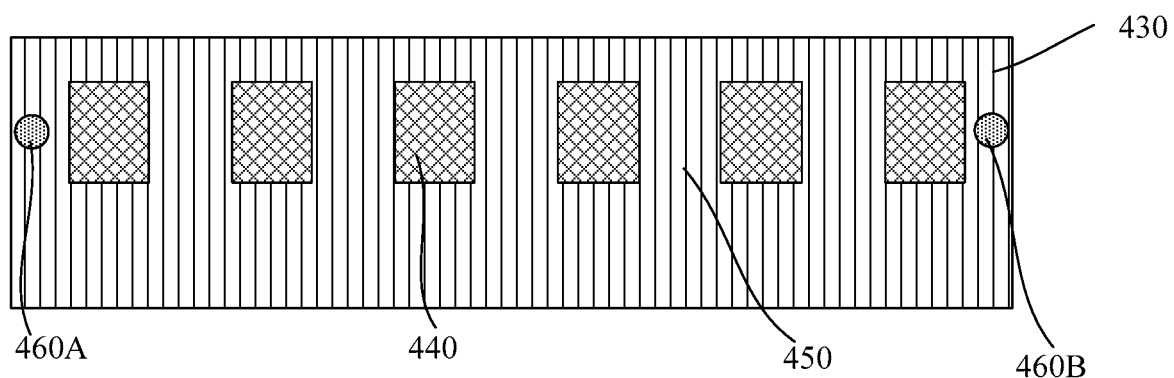
FIG. 4B is a top view for illustrating the substrate during evaporation.

FIG. 4A is a cross-sectional view a combined structure of the mask component and the substrate during evaporation, and a portion of the mask component 30 as shown is the cross section along the line A-B in FIG. 3B. FIG. 4B is a top view for a substrate 430 of FIG. 4A during evaporation. As shown in FIG. 4A and FIG. 4B, in embodiments of the present disclosure, the mask component 30 is used for evaporating a light emitting material on the substrate 430. The mask component 30 comprises opening regions 410, non-opening regions 420, and the plurality of second mark points 312A and 312B. The film is formed on the substrate 430 by evaporation with the mask component 30. The substrate 430 comprises PDL opening regions 440 and non-opening regions 450.

If the opening regions 410 of the mask component 30 (e.g. the opening regions of the metal strips 311) are not completely aligned with the PDL opening regions 440 of the substrate 430, the light emitting material is evaporated on the substrate 430 through the opening regions 410 of the mask component 30. In this case, some of the light emitting material is evaporated on a region outside the PDL opening regions 440, and the color mixing phenomenon occurs. The evaporation accuracy of the light emitting material is affected by such a factor that the opening regions 410 of the mask component 30 are not completely aligned with the PDL opening regions 440 of the substrate.

When the mask component 30 is used for evaporating the light emitting material on the substrate 430, the plurality of second mark points formed on the mask component 30 will form a corresponding plurality of third mark points 460A, 460B (only two of the third mark points are shown) on the substrate 430. When the evaporation accuracy of the light emitting material is low, an offset of the plurality of third mark points 460A, 460B on the substrate with respect to the plurality of second mark points 312A, 312B on the mask component 30 occurs, and a second offset displacement of the plurality of third mark points 460A, 460B on the substrate is thus obtained.

Step 203, determining an actual offset displacement between an actual forming position and a preset forming position of a film, according to the first offset displacement and the second offset displacement.

In embodiments of the present disclosure, the actual offset displacement of the preset forming position of the light emitting material is calculated, according to the first offset displacement of the plurality of second mark points on the mask component 30 and the second offset displacement of the plurality of third mark points on the substrate.

Step 204, modifying the preset forming position of the film, according to the actual offset displacement between the actual forming position and the preset forming position of the film.

In embodiments of the present disclosure, the preset forming position of the light emitting material is modified, according to the calculated actual offset displacement of the light emitting material between the actual forming position and the preset forming position.

In some embodiments, the position of PDL is modified, according to the actual offset displacement of the light emitting material between the actual forming position and the preset forming position. In alternative embodiments, the position of the opening regions 410 of the mask component 30 is modified, according to the actual offset displacement of the light emitting material between the actual forming position and the preset forming position.

If the position of PDL is modified, the PDL is re-formed on another substrate according to the modified position of PDL, and the mask component 30 is again used for evaporating the light emitting material. If the position of the opening regions 410 of the mask component 30 is modified, the mask component is re-formed, the PDL is re-formed on another substrate, the position of the re-formed PDL is not changed, and the re-formed mask component is used for evaporating the light emitting material.

Figure 5:
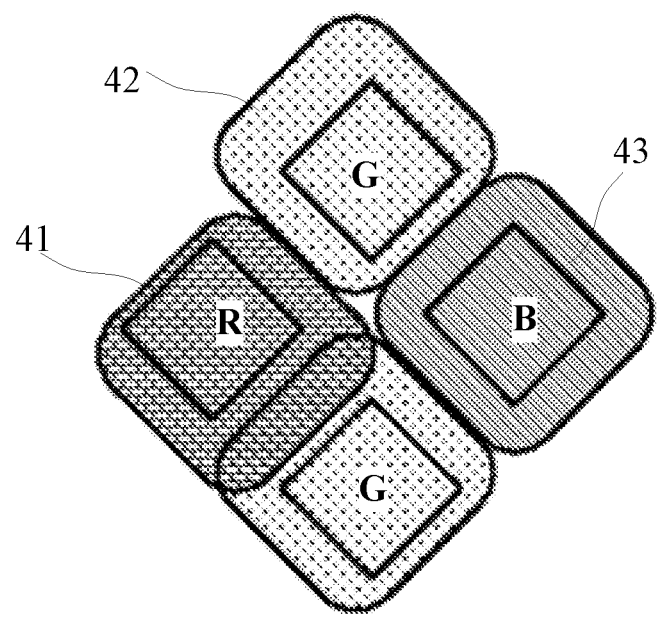
FIG. 5 is a structural view for illustrating absence of color mixing phenomenon after modify preset forming position of the light emitting material.

The deposition position of the light emitting material is re-determined, according to the actual offset displacement of the light emitting material between the actual forming position and the preset forming position. In this way, when the light emitting material is evaporated for the next time, the previous offset displacement can be eliminated. As a result, and as shown in FIG. 5, a red light emitting material 41 covers the PDL opening regions to which red pixels correspond, a green light emitting material 42 covers the PDL opening regions to which green pixels correspond, and a blue light emitting material 43 covers the PDL opening regions to which blue pixels correspond. The defect of color mixing is thus improved.

In embodiments of the present disclosure, the first offset displacement of the plurality of second mark points on the mask component is obtained, the second offset displacement of the plurality of third mark points on the substrate is obtained, and the plurality of third mark points are formed on the substrate by the plurality of second mark points when a film is evaporated on the substrate with the mask component. The actual offset displacement of the light emitting material between the actual forming position and the preset forming position is determined, according to the first offset displacement and the second offset displacement. The preset forming position of the light emitting material is modified, according to the actual offset displacement of the light emitting material between the actual forming position and the preset forming position. The actual offset displacement of the light emitting material between the actual forming position and the preset forming position is determined, according to the offset displacement between the second mark points on the mask component and the third mark points on the substrate. The deposition position of the light emitting material is re-determined, according to the actual offset displacement of the light emitting material between the actual forming position and the preset forming position. When the light emitting material is evaporated for the next time, the previous offset displacement can be eliminated. The defect of color mixing is thus improved.

It is noted that in the description of the present disclosure, the "actual forming position" or "preset forming position" of film not only means an absolute actual forming position or an absolute preset forming position of the film, but also means the relative position of the film with respect to the substrate or other reference object. For example, it can mean the relative position of the film with respect to PDL.

Figure 6:
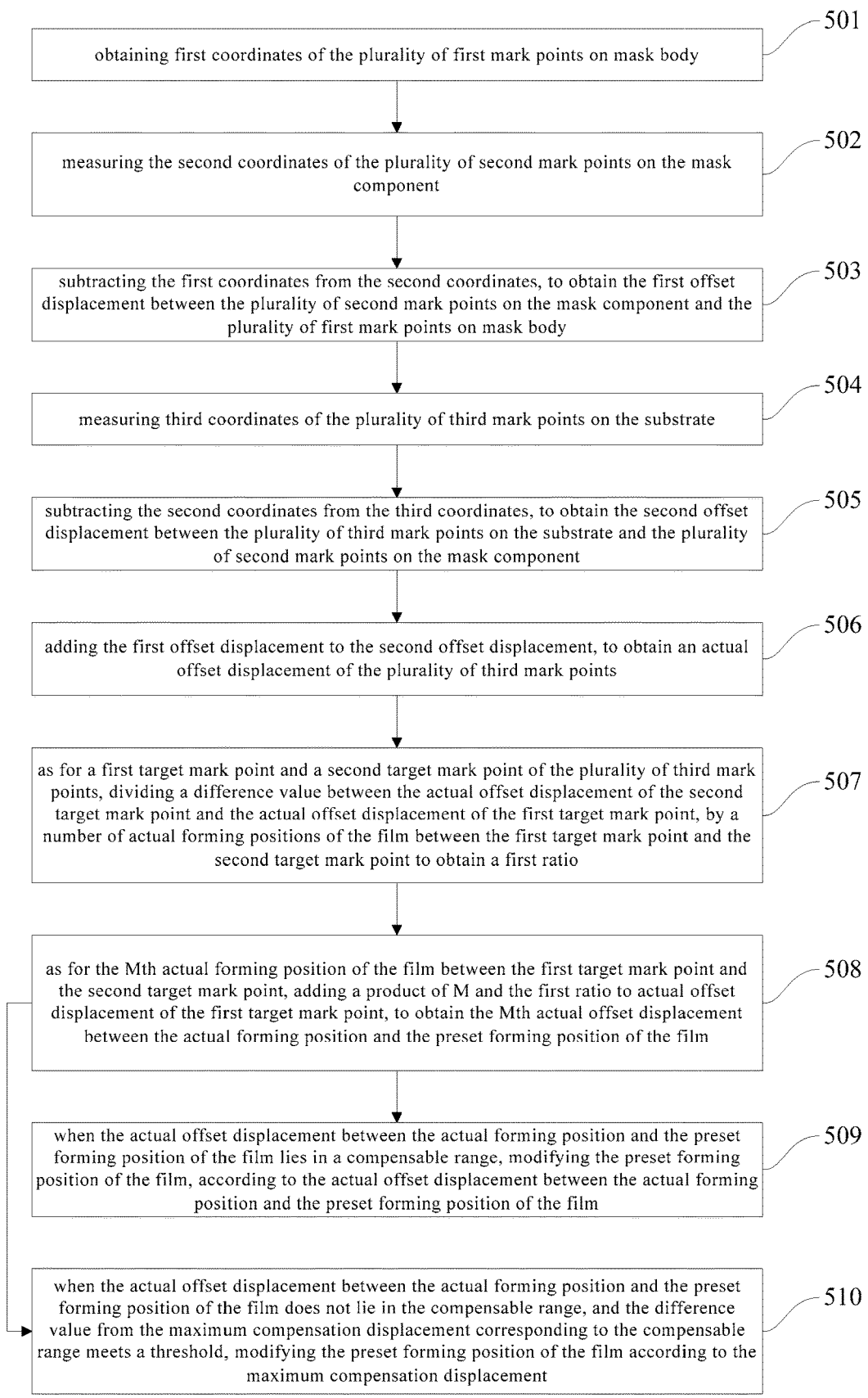
FIG. 6 is a flow chart for illustrating a method for modifying a film deposition position in a film deposition process with a mask component in an embodiment of the present disclosure.

According to a method in another exemplary embodiment of the present disclosure, reference is made to FIG. 6, which shows a flow chart for a method for modifying a film deposition position in a film deposition process with a mask component in an embodiment of the present disclosure. The method can comprise the following steps.

Step 501, obtaining first coordinates of the plurality of first mark points on mask body.

In embodiments of the present disclosure, during forming the mask body 31 according to a design drawing, the plurality of metal strips 311 are firstly formed. The plurality of metal strips 311 are distributed uniformly. The plurality of opening regions (not shown in FIG. 3A and FIG. 3B) and the plurality of first mark points 302A, 302B are then formed in the metal strips 311.

In case the FMM fabrication accuracy (e.g., the accuracy for processing the mask body 31) is ignored, the first coordinates of the plurality of first mark points on the formed mask body 31 can be determined when the drawing is designed. Obtaining the first coordinates of the plurality of first mark points on the mask body 31 means obtaining the first coordinates of the plurality of first mark points in the design drawing when the mask body 31 is designed.

It is noted that in the context of the present disclosure, unless otherwise defined, the term "offset displacement" (e.g., the first offset displacement, the second offset displacement, the actual offset displacement) indicates a displacement between projections of components or positions on a plane parallel with the substrate. In addition, in the context of the present disclosure, unless otherwise defined, the term "coordinates" (e.g., the first coordinates, the second coordinates) indicates a coordinates of projection of components or positions on the plane parallel with the substrate, i.e., a coordinates of components or positions in a same two-dimensional coordinates system in the plane parallel with the substrate. The origin of coordinates can any fixed point in this plane.

For example, after stretching, two of the plurality of first mark points, e.g., first mark points 302A and 302B on the mask body 31 are changed into second mark points 312A and 312B, and the first coordinates for these two first mark point 302A and 302B are (x10, y10) and (x11, y11), respectively.

Step 502, measuring the second coordinates of the plurality of second mark points on the mask component.

In embodiments of the present disclosure, the formed mask body 31 is fixed to the mask frame 32 to form the mask component 30, and the second coordinates of the plurality of second mark points 312A, 312B on the mask component 30 can be acquired by a camera.

For example, the second coordinates of the second mark points 312A and 312B on the mask component 30 are (x20, y20) and (x21, y21), respectively.

Step 503, subtracting the first coordinates from the second coordinates, to obtain the first offset displacement between the plurality of second mark points on the mask component and the plurality of first mark points on mask body.

In embodiments of the present disclosure, by subtracting the first coordinates of the corresponding first mark points 302A, 302B on the mask body 31 from the second coordinates of the plurality of second mark points 312A, 312B on the mask component 30, the first offset displacement between the plurality of second mark points 312A, 312B on the mask component 30 and the plurality of first mark points on the mask body 302A, 302B is obtained.

For example, the first offset displacement of the second mark point 312A is $\overrightarrow{R10}=(x20-x10, y20-y10)$, and the first offset displacement of the second mark points 312B is $\overrightarrow{R11}=(x21-x11, y21-y11)$.

Step 504, measuring third coordinates of the plurality of third mark points on the substrate.

In embodiments of the present disclosure, the mask component 30 is used for evaporating the light emitting material on the substrate 430. Since the plurality of second mark points 312A, 312B are formed on the mask component 30, during evaporating the light emitting material on the substrate 430 by using the mask component 30, the corresponding third mark points 460A, 460B can be formed on the substrate 430 accordingly by the second mark points 312A, 312B. The third coordinates of the plurality of third mark points 460A, 460B on the substrate can be acquired by a camera.

For example, the third coordinate of the third mark point 460A formed by the second mark point 312A on the substrate 430 is (x30, y30), and the third coordinate of the third mark point 460B formed by the second mark point 312B on the substrate is (x31, y31).

Step 505, subtracting the second coordinates from the third coordinates, to obtain the second offset displacement between the plurality of third mark points on the substrate and the plurality of second mark points on the mask component.

In embodiments of the present disclosure, by subtracting the second coordinates of the corresponding second mark points 312A, 312B on the mask component 30 from the third coordinates of the plurality of third mark points 460A, 460B on the substrate 430, the second offset displacement of the plurality of third mark points 460A, 460B on the substrate are obtained.

For example, the second coordinate (x20, y20) of the second mark point 312A is subtracted from the third coordinate (x30, y30) of the third mark point 460A formed on the substrate by the second mark point 312A, so that the second offset displacement $\overrightarrow{R20}$ of the third mark point 460A formed on the substrate by the second mark point 312A is obtained, i.e., $\overrightarrow{R20}=(x30-x20, y30-y20)$. The second coordinate (x21, y21) of the second mark points 312B is subtracted from the third coordinate (x31, y31) of the third mark point 460B formed on the substrate by the second mark points 312B, so that the second offset displacement $\overrightarrow{R21}$ of the third mark point 460B formed on the substrate by the second mark point 312B is obtained, i.e., $\overrightarrow{R21}=(x31-x21, y31-y21)$.

Step 506, adding the first offset displacement to the second offset displacement, to obtain an actual offset displacement of the plurality of third mark points.

In embodiments of the present disclosure, by adding the second offset displacement of the plurality of third mark points on the substrate with the first offset displacement of the plurality of second mark points on the mask component, the actual offset displacement of the plurality of third mark points is obtain.

The first offset displacement is an offset displacement which is produced by the mask component stretching process, during forming the mask body 31 and fixing the mask body 31 to the mask frame 32. The second offset displacement is an offset displacement which is produced by the evaporation process, during evaporating the light emitting material on the substrate 430 with the mask component 30. The offset displacement produced by the mask component forming process and the offset displacement produced by the evaporation process finally cause the actual offset displacement of the light emitting material between the actual forming position and the preset forming position.

For example, the third mark point 460A, which is formed on the substrate by the second mark point 312A, has an actual offset displacement $\overrightarrow{R30}=\overrightarrow{R10}+\overrightarrow{R20}$, and the second mark point 460B formed on the substrate by the second mark point 312B has an actual offset displacement $\overrightarrow{R31}=\overrightarrow{R11}+\overrightarrow{R21}$.

Step 507, as for a first target mark point and a second target mark point of the plurality of third mark points, dividing a difference value between the actual offset displacement of the second target mark point and the actual offset displacement of the first target mark point, by a number of actual forming positions of the film between the first target mark point and the second target mark point to obtain a first ratio.

In embodiments of the present disclosure, as for a first target mark point and a second target mark point of the plurality of third mark points, by subtracting the actual offset displacement of the first target mark point from the actual offset displacement of the second target mark point, a difference value D between the actual offset displacement of the second target mark point and the actual offset displacement of the first target mark point is obtained.

Due to a limited number of the formed third mark points, a plurality of actual forming positions of the light emitting material will be present between the first target mark point and the second target mark point. If the number of actual forming positions of the light emitting material between the first target mark point and the second target mark point is N, N being a positive integer larger than 0, the difference value D as described above is divided by N to obtain a first ratio P.

For example, by setting the first target mark point as the third mark point 460A which is formed on the substrate by the second mark point 312A, and setting the second target mark point as the second mark point 312B which is formed on the substrate by the third mark point 460B, a difference value D between the actual offset displacement of the second target mark point and the actual offset displacement of the first target mark point is $D=\overrightarrow{R31}-\overrightarrow{R30}$. Then, the first ratio P is $P=D/N=(\overrightarrow{R31}-\overrightarrow{R30})/N$. Since the difference value D in fact means displacement difference, the first ratio P as calculated in fact is also a displacement vector.

Step 508, as for the Mth actual forming position of the film between the first target mark point and the second target mark point, adding a product of M and the first ratio to actual offset displacement of the first target mark point, to obtain the Mth actual offset displacement between the actual forming position and the preset forming position of the film, M being a positive integer larger than 0.

In embodiments of the present disclosure, as for the Mth actual forming position of the light emitting material between the first target mark point and the second target mark point, M is multiplied by the first ratio P, and the product is added to the actual offset displacement of the first target mark point. In this way, the Mth actual offset displacement $R_M$ of the light emitting material between the actual forming position and the preset forming position can be obtained by calculation, M being a positive integer larger than 0.

For example, if the number of actual forming positions of the light emitting material between the first target mark point 460A and the second target mark point 460B is 3, (i.e., N is 3), as for the second actual forming position of the light emitting material between the first target mark point 460A and the second target mark point 460B (i.e., M is 2), then $RM=2\times P+\overrightarrow{R30}$.

Step 509, when the actual offset displacement between the actual forming position and the preset forming position of the film lies in a compensable range, modifying the preset forming position of the film, according to the actual offset displacement between the actual forming position and the preset forming position of the film.

In embodiments of the present disclosure, when the actual offset displacement of the light emitting material between the actual forming position and the preset forming position lies in the compensable range, the preset forming position of the light emitting material is modified directly according to the actual offset displacement of the light emitting material between the actual forming position and the preset forming position.

The modifying can comprise the following two modes.

In a first mode, the offset displacement of PDL is determined, based on the actual offset displacement between the actual forming position and the preset forming position of the film. In this case, the actual offset displacement between the actual forming position and the preset forming position of the film has a same corresponding distance and a same direction as the offset displacement of PDL.

Since the light emitting material is formed in the opening regions of PDL, the position of PDL can be modified, to modify the preset forming position of the light emitting material. The offset displacement of PDL is determined, according to the actual offset displacement of the light emitting material between the actual forming position and the preset forming position. In order to guarantee that, after modification of PDL, the light emitting material can be correctly formed in the opening regions of PDL, the actual offset displacement of the light emitting material between the actual forming position and the preset forming position has a same corresponding distance and a same direction as the offset displacement of PDL.

An example of the actual offset displacement of the light emitting material between the actual forming position and the preset forming position is shown in FIG. 1. The actual forming position of the red light emitting material is offset to the right side, and covers opening regions of PDL of the green pixel.

Figure 7:
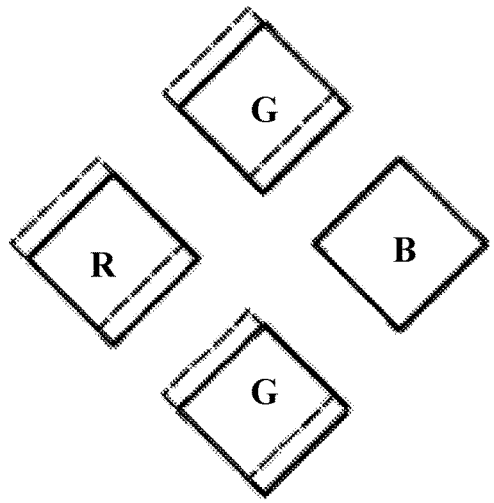
FIG. 7 is a structural view for illustrating a pixel definition layer prior to modifying and after modifying.

An example of modifying the offset displacement of PDL is shown in FIG. 7. In some embodiments, the opening regions of PDL to which the red light emitting material corresponds and the opening regions of PDL to which the green light emitting material corresponds can be offset to the bottom right side. The dashed line indicates a position prior to PDL modifying, the solid line indicates a position after PDL modifying, and the distance between the solid line and the dashed line is the actual offset displacement of the light emitting material between the actual forming position and the preset forming position.

In a second mode, the offset displacement of corresponding opening regions on the mask component is determined, according to the actual offset displacement between the actual forming position and the preset forming position of the film. In this case, the actual offset displacement between the actual forming position and the preset forming position of the film and the offset displacement of the corresponding opening regions on the mask component have a same corresponding distance but opposite direction.

Since the light emitting material is evaporated in PDL on the substrate through the opening regions in the mask component, the position of the corresponding opening regions on the mask component can be modified, to modify the preset forming position of the light emitting material. According to the actual offset displacement of the light emitting material between the actual forming position and the preset forming position, the offset displacement of the corresponding opening regions on the mask component is determined. In order to guarantee that after modifying the position of the opening regions in the mask component, during evaporating the light emitting material on the substrate with the modified mask component, the light emitting material can be correctly formed in the opening regions of PDL, the actual offset displacement of the light emitting material between the actual forming position and the preset forming position and the offset displacement of the corresponding opening regions on the mask component have a same corresponding distance but opposite direction.

For example, the actual forming position of the red light emitting material is offset to the right side in FIG. 1, the position of the opening regions in the mask component can be accordingly offset to the left side, i.e., the position of the opening regions is modified to the left side during forming the mask component.

Step 510, when the actual offset displacement between the actual forming position and the preset forming position of the film does not lie in the compensable range, and the difference value from the maximum compensation displacement corresponding to the compensable range meets a threshold, modifying the preset forming position of the film according to the maximum compensation displacement.

In embodiments of the present disclosure, when the actual offset displacement of the light emitting material between the actual forming position and the preset forming position does not lie in the compensable range, and the difference value from the maximum compensation displacement corresponding to the compensable range meets a threshold, the preset forming position of the light emitting material is modified according to the maximum compensation displacement corresponding to the compensable range.

It is noted that, in case the actual offset displacement of the light emitting material between the actual forming position and the preset forming position does not lie in the compensable range, and the difference value from the maximum compensation displacement corresponding to the compensable range is not so large, i.e., the difference value from the maximum compensation displacement is smaller than the threshold, the preset forming position of the light emitting material can be partially modified.

Correspondingly, the preset forming position of the light emitting material can be partially modified in the following two modes. In the first mode, the position of PDL is modified, to partially modify the preset forming position of the light emitting material. In the second mode, the position of the corresponding opening regions on the mask component is modified, to partially modify the preset forming position of the light emitting material.

In the first mode, the offset displacement of PDL is determined according to the maximum compensation displacement. The maximum compensation displacement has a same corresponding distance and a same direction as the offset displacement of PDL.

In the second mode, the offset displacement of the corresponding opening regions on the mask component is determined, according to the maximum compensation displacement. The maximum compensation displacement and the offset displacement of the corresponding opening regions on the mask component have a same corresponding distance but opposite direction.

However, when the actual offset displacement of the light emitting material between the actual forming position and the preset forming position does not lie in the compensable range, and the difference value from the maximum compensation displacement corresponding to the compensable range does not meet a threshold, i.e., the difference value from the maximum compensation displacement is larger than the threshold, the actual offset displacement of the light emitting material between the actual forming position and the preset forming position is still too large, the color mixing may even occur after partially modifying. In this case, if the first offset displacement produced during the mask component forming process is relatively large, the forming process of FMM is modified, or the stretching strength is modified during fixing the mask body and the mask frame to form the mask component. The new mask component is used for evaporating the light emitting material, and the actual offset displacement of the light emitting material between the actual forming position and the preset forming position is re-calculate, to modify the preset forming position of the light emitting material. If the second offset displacement produced by the evaporation process is relatively large, the mask component and the substrate can be re-aligned, or parameters like an evaporation angle for the light emitting material can be modified, to re-evaporate the light emitting material on the substrate. The actual offset displacement of the light emitting material between the actual forming position and the preset forming position is re-calculated after evaporation, so as to modify the preset forming position of the light emitting material.

Figure 8:
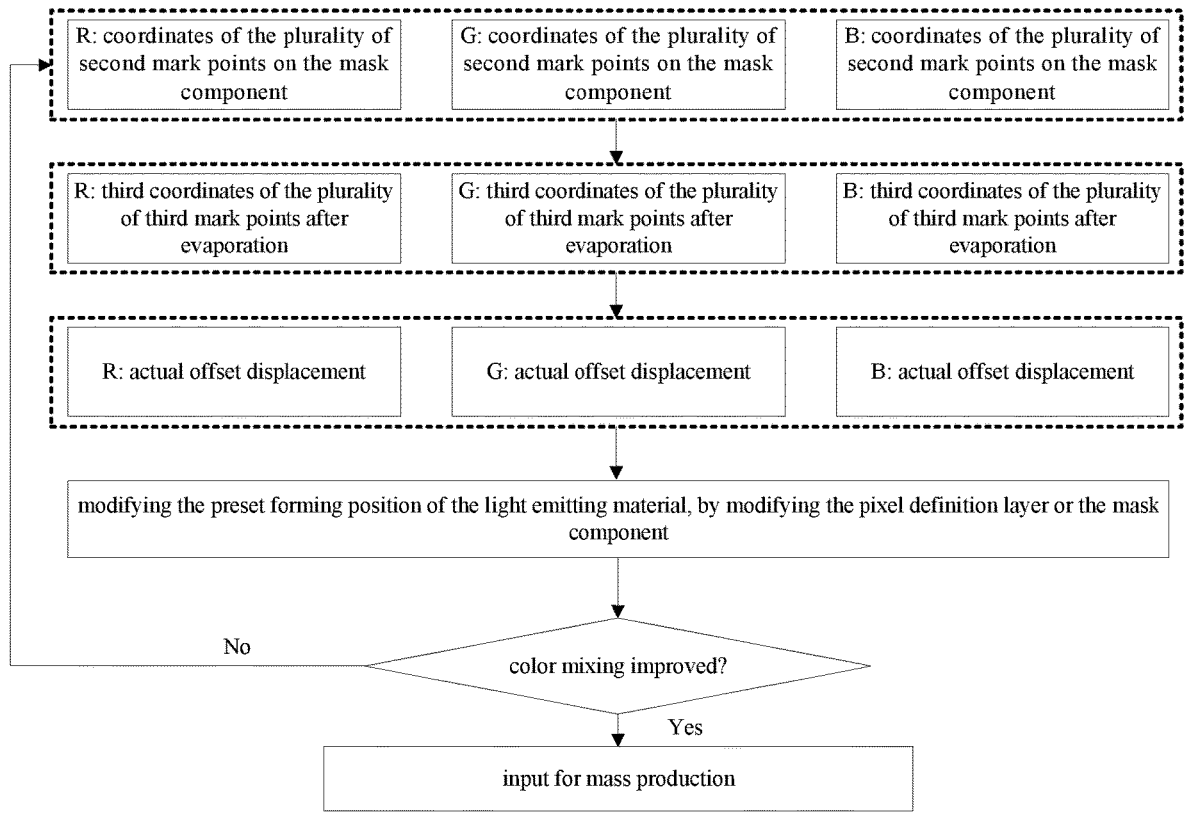
FIG. 8 is a modify flow chart for modifying a preset forming position of a light emitting material.

Reference is made to FIG. 8, which shows a flow chart of modifying the preset forming position of the light emitting material.

In some embodiments, if the first offset displacement is not considered, the preset forming position of the light emitting material can be modified according to the following procedure.

The light emitting material is evaporated on the substrate through the opening regions of PDL, and this is usually performed for 3 times to evaporate the red light emitting material, the green light emitting material and the blue light emitting material, respectively. During each evaporation, different mask components are used for different light emitting materials. Coordinates of the plurality of second mark points on the mask component for the red light emitting material R are measured, coordinates of the plurality of second mark points on the mask component for the green light emitting material G are measured, and coordinates of the plurality of second mark points on the mask component for the blue light emitting material B are measured. Measuring the coordinates of the plurality of second mark points means measuring the second coordinates.

After the light emitting material is evaporated on the substrate by respective mask component, the corresponding plurality of third mark points are formed in corresponding regions of the substrate. The third coordinates of the plurality of third mark points which are formed after evaporation of the red light emitting material R on the substrate are measured, the third coordinates of the plurality of third mark points which are formed after evaporation of the green light emitting material G on the substrate are measured, and the third coordinates of the plurality of third mark points which are formed after evaporation of the blue light emitting material B on the substrate are measured.

Then, according to the second coordinates of the plurality of second mark points on the mask component and the third coordinates of the plurality of third mark points on the substrate, the actual offset displacement between the actual forming position and the preset forming position of the red light emitting material R, the actual offset displacement between the actual forming position and the preset forming position of the green light emitting material G, and the actual offset displacement between the actual forming position and the preset forming position of the blue light emitting material B are obtained by calculation, respectively.

Then, the position of PDL is modified, or the position of the corresponding opening regions on the mask component is modified, so as to modify the preset forming position of the light emitting material. The light emitting material is re-evaporated, and the actual forming position of the light emitting material is modified. Besides, the improvement result of the color mixing phenomenon is confirmed by detecting the evaporation result of the light emitting material. When the red light emitting material covers the PDL opening regions of the red pixel, the green light emitting material covers the PDL opening regions of the green pixel, and the blue light emitting material covers the PDL opening regions of the blue pixel, it means the color mixing phenomenon is well improved, and can be directly input for mass production. When the color mixing phenomenon still exists for a large proportion, this indicates that the color mixing phenomenon is not improved at all or improved by a small extent. Thus, it is required to re-measure the second coordinates of the plurality of second mark points on the mask component, and the third coordinates of the plurality of third mark points on the substrate, and to re-modify a preset forming position of a light emitting material.

It is noted that the light emitting material of a same color is formed in the plurality of opening regions of PLED on the substrate with the mask component. Thus, during modifying the preset forming position of the light emitting material, the modification is not performed on each light emitting material. Instead, the preset forming position of all light emitting materials are continuously and uniformly modified, according to the actual offset displacement between the actual forming position and the preset forming position of each light emitting material. Namely, the modification is performed according to the actual offset displacement between the actual forming position and the preset forming position of each light emitting material.

In addition, in this case, in order to decrease the occurrence rate of the color mixing phenomenon, the distance between two PDL opening regions is usually increased. However, this will cause the aperture ratio to decrease. In embodiments of the present disclosure, the defect of color mixing can be effectively improved. Thus, the distance between two PDL opening regions can be decreased in the design, so as to increase the aperture ratio and the lifetime of the light emitting device.

In embodiments of the present disclosure, the first coordinates of the plurality of first mark points on the mask body and the second coordinates of the plurality of second mark points on the mask component are obtained, so that the first offset displacement of the plurality of second mark points on the mask component is obtained. The third coordinates of the plurality of third mark points on the substrate are measured, and the third coordinates are subtracted from the second coordinates, so that the second offset displacement of the plurality of third mark points on the substrate is obtained. The first offset displacement is added to the second offset displacement, so that the actual offset displacement of the plurality of third mark points is obtained, and thus the actual offset displacement of the light emitting material between the actual forming position and the preset forming position is obtained. The deposition position of the light emitting material is re-determined, according to the actual offset displacement of the light emitting material between the actual forming position and the preset forming position. In this way, when the light emitting material is evaporated for the next time, the previous offset displacement can be eliminated. The defect of color mixing is thus improved. Besides, the distance between two PDL opening regions can be decreased, so as to increase the aperture ratio and the lifetime of the light emitting device.

Figure 9:
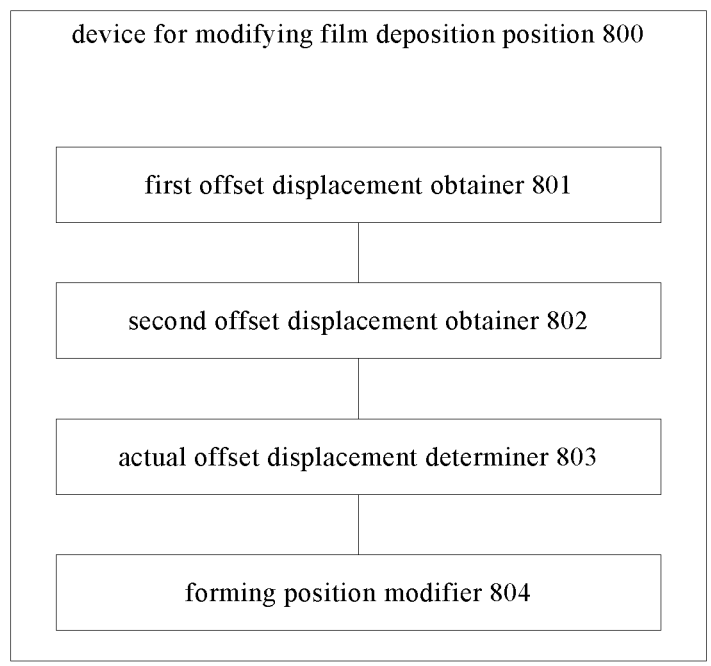
FIG. 9 is a structural diagram for illustrating a device for modifying film deposition position in a film deposition process with a mask component in an embodiment of the present disclosure.

In a device according to an exemplary embodiment of the present disclosure, reference is made to FIG. 9, which is a structural diagram of a device for modifying film deposition position in a film deposition process with a mask component in an embodiment of the present disclosure. The mask component comprises a mask frame and a mask body fixed to the mask frame.

In embodiments of the present disclosure, a device for modifying film deposition position 800 comprises:

a first offset displacement obtainer 801, configured to obtain a first offset displacement between a plurality of second mark points on the mask component and a plurality of first mark points on the mask body;

a second offset displacement obtainer 802, configured to obtain a second offset displacement between the plurality of third mark points on the substrate and the plurality of second mark points on the mask component, wherein the plurality of third mark points are formed on the substrate by the plurality of second mark points when a film is evaporated on the substrate with the mask component;

an actual offset displacement determiner 803, configured to determine an actual offset displacement between an actual forming position and a preset forming position of the film, according to the first offset displacement and the second offset displacement; and forming position modifier 804, configured to modify the preset forming position of the film, according to the actual offset displacement between the actual forming position and the preset forming position of the film.

Figure 10:
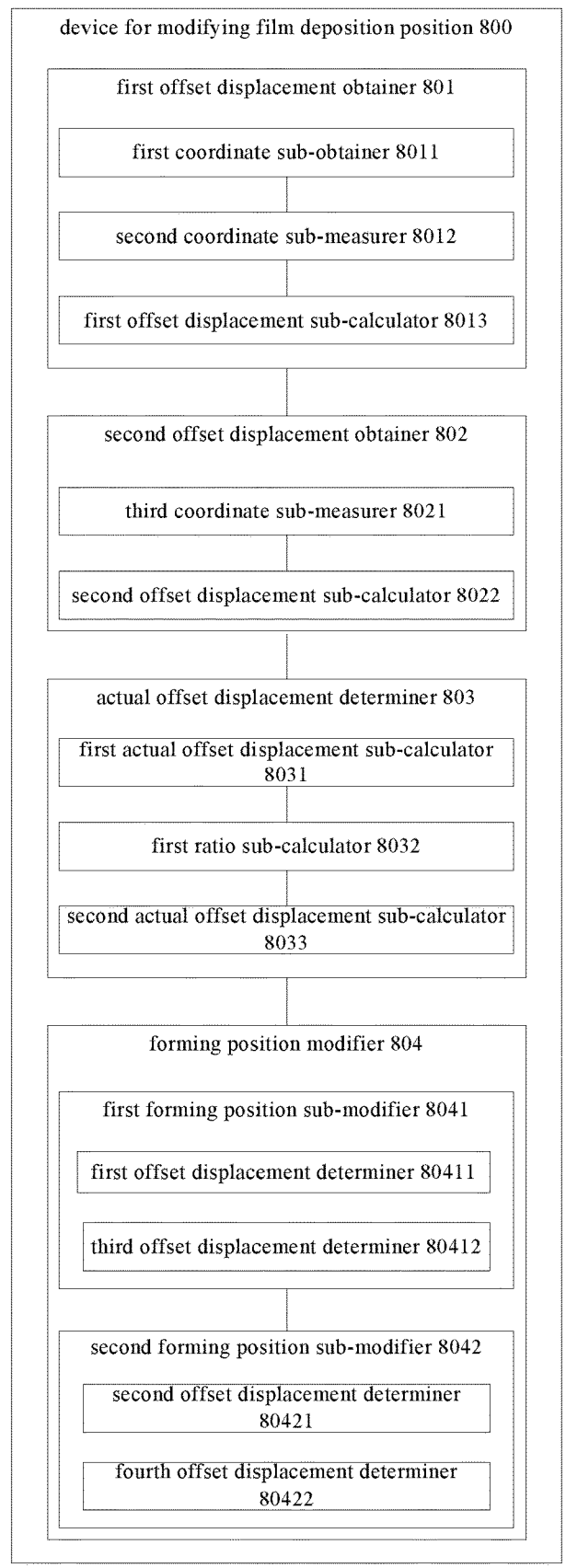
FIG. 10 is a structural diagram for illustrating a device for modifying film deposition position in a film deposition process with a mask component in an embodiment of the present disclosure.

Reference is made to FIG. 10, which shows a structural diagram for a device for modifying film deposition position in a film deposition process with a mask component in an embodiment of the present disclosure.

On the basis of FIG. 9, optionally, the first offset displacement obtainer 801 comprises:

a first coordinate sub-obtainer 8011, configured to obtain first coordinates of the plurality of first mark points on the mask body;

a second coordinate sub-measurer 8012, configured to measure second coordinates of the plurality of second mark points on the mask component; and a first offset displacement sub-calculator 8013, configured to subtract the first coordinates from the second coordinates, to obtain the first offset displacement between the plurality of second mark points on the mask component and the plurality of first mark points on mask body.

Optionally, the second offset displacement obtainer 802 comprises:

a third coordinate sub-measurer 8021, configured to measure third coordinates of the plurality of third mark points on the substrate; and a second offset displacement sub-calculator 8022, configured to subtract the second coordinates from the third coordinates, and obtain the second offset displacement between the plurality of third mark points on the substrate and the plurality of second mark points on the mask component.

Optionally, the actual offset displacement determiner 803 comprises:

a first actual offset displacement sub-calculator 8031, configured to add the first offset displacement to the second offset displacement, and obtain an actual offset displacement of the plurality of third mark points;

a first ratio sub-calculator 8032, configured to, as for a first target mark point and a second target mark point of the plurality of third mark points, divide a difference value between the actual offset displacement of the second target mark point and the first target mark point by a number of actual forming positions of the film (e.g., the light emitting material) between the first target mark point and the second target mark point; and a second actual offset displacement sub-calculator 8033, configured to, as for the Mth actual forming position of the film between the first target mark point and the second target mark point, add a product of M and the first ratio to actual offset displacement of the first target mark point, to obtain the Mth actual offset displacement between the actual forming position and the preset forming position of the film, M being a positive integer larger than 0.

Optionally, the forming position modifier 804 comprises:

a first forming position sub-modifier 8041, configured to, when the actual offset displacement between the actual forming position and the preset forming position of the film lies in a compensable range, modify the preset forming position of the film, according to the actual offset displacement between the actual forming position and the preset forming position of the film;

a second forming position sub-modifier 8042, configured to, when the actual offset displacement between the actual forming position and the preset forming position of the film does not lie in the compensable range, and the difference value from the maximum compensation displacement corresponding to the compensable range meets a threshold, modify the preset forming position of the film according to the maximum compensation displacement.

Optionally, the first forming position sub-modifier 8041 comprises: a first offset displacement determiner 80411, configured to determine the offset displacement of PDL, according to the actual offset displacement between the actual forming position and the preset forming position of the film, wherein the actual offset displacement between the actual forming position and the preset forming position of the film has a same corresponding distance and a same direction as the offset displacement of PDL, and the second forming position sub-modifier 8042 comprises:

a second offset displacement determiner 80421, configured to determine the offset displacement of PDL according to the maximum compensation displacement, wherein the maximum compensation displacement has a same corresponding distance and a same direction as the offset displacement of PDL.

Optionally, the first forming position sub-modifier 8041 comprises: a third offset displacement determiner 80412, configured to determine the offset displacement of the corresponding opening regions on the mask component, according to the actual offset displacement between the actual forming position and the preset forming position of the film, wherein the actual offset displacement between the actual forming position and the preset forming position of the film and the offset displacement of the corresponding opening regions on the mask component have a same corresponding distance but opposite direction;

and the second forming position sub-modifier 8042 comprises: a fourth offset displacement determiner 80422, configured to determine the offset displacement of the corresponding opening regions on the mask component, according to the maximum compensation displacement, wherein the maximum compensation displacement and the offset displacement of the corresponding opening regions on the mask component have a same corresponding distance but opposite direction.

In embodiments of the present disclosure, the first offset displacement of the plurality of second mark points on the mask component is obtained, the second offset displacement of the plurality of third mark points on the substrate is obtained, and the plurality of third mark points are formed on the substrate by the plurality of second mark points when a film is evaporated on the substrate with the mask component. The actual offset displacement of the light emitting material between the actual forming position and the preset forming position is determined, according to the first offset displacement and the second offset displacement. The preset forming position of the light emitting material is modified, according to the actual offset displacement of the light emitting material between the actual forming position and the preset forming position. The actual offset displacement of the light emitting material between the actual forming position and the preset forming position is determined, according to the offset displacement between the second mark points on the mask component and the third mark points on the substrate. The deposition position of the light emitting material is re-determined, according to the actual offset displacement of the light emitting material between the actual forming position and the preset forming position. When the light emitting material is evaporated for the next time, the previous offset displacement can be eliminated. The defect of color mixing is thus improved.

In the embodiments as described above, the method is described as a combination of a series of actions for simplicity. However, it will be understood by a person with ordinary skill in the art that the present disclosure is not limited to the sequence of actions as described. According to the present disclosure, some steps can be performed in another sequence or at the same time. In addition, it will also be understood by the person with ordinary skill in the art that the embodiments in specification belong to representative embodiments, and the related actions and modules may not be necessary in the present disclosure.

Embodiments of the present disclosure are described in a progressive manner, and each embodiment focuses on the difference from other embodiments. The common portions of these embodiments can be referenced with one another.

Finally, it is further noted that in this context, the relationship terms such as "first", "second", do not mean any relationship or sequence of entities or operations, but are only used to distinguish an entity or operation from another entity or operation. Besides, the term "comprises", "comprising" or any variant thereof means that an element or article prior to this term encompasses element(s) or article(s) listed behind this term and equivalents, but does not preclude the presence of other elements or articles.

The method and device for modifying a film deposition position in a film deposition process with a mask component of the present disclosure have been described in detail. The principle and implementations of the present disclosure have been elucidated by referring to examples. The above description of these embodiments only intends to facilitate understanding the method and its core idea of the present disclosure. Besides, the person with ordinary skill in the art may come up with variations of the implementations and application range of the present disclosure. Thus, the specification shall not be construed as limitations to the present disclosure.

What is claimed is:

1. A method for modifying a film deposition position in a film deposition process with a mask component, wherein the mask component comprises a mask frame and a mask body fixed to the mask frame, the method comprising:

obtaining a first offset displacement between a plurality of second mark points on the mask component and a plurality of first mark points on the mask body;

obtaining a second offset displacement between a plurality of third mark points on a substrate and the plurality of second mark points on the mask component, wherein the plurality of third mark points are formed by the plurality of second mark points on the substrate when a film is evaporated on the substrate with the mask component;

determining an actual offset displacement between an actual forming position and a preset forming position of the film, according to the first offset displacement and the second offset displacement; and modifying the preset forming position of the film, according to the actual offset displacement between the actual forming position and the preset forming position of the film.

2. The method of claim 1, wherein the obtaining the first offset displacement between the plurality of second mark points on the mask component and the plurality of first mark points on the mask body comprises:

obtaining first coordinates of the plurality of first mark points on the mask body;

measuring second coordinates of the plurality of second mark points on the mask component; and subtracting the first coordinates from the second coordinates, to obtain the first offset displacement between the plurality of second mark points on the mask component and the plurality of first mark points on mask body.

3. The method of claim 2, wherein the obtaining the second offset displacement between the plurality of third mark points on the substrate and the plurality of second mark points on the mask component comprises:

measuring third coordinates of the plurality of third mark points on the substrate; and subtracting the second coordinates from the third coordinates, to obtain the second offset displacement between the plurality of third mark points on the substrate and the plurality of second mark points on the mask component.

4. The method of claim 1, wherein the determining the actual offset displacement between the actual forming position and the preset forming position of the film, according to the first offset displacement and the second offset displacement, comprises:

adding the first offset displacement to the second offset displacement, to obtain an actual offset displacement of the plurality of third mark points;

for a first target mark point and a second target mark point of the plurality of third mark points, dividing a difference value between the actual offset displacement of the second target mark point and the first target mark point by a number of actual forming positions of the film between the first target mark point and the second target mark point to obtain a first ratio; and for an Mth actual forming position of the film between the first target mark point and the second target mark point, adding a product of M and the first ratio to actual offset displacement of the first target mark point, to obtain the Mth actual offset displacement between the actual forming position and the preset forming position of the film, M being a positive integer greater than 0.

5. The method of claim 1, wherein the modifying the preset forming position of the film, according to the actual offset displacement between the actual forming position and the preset forming position of the film, comprises:

when the actual offset displacement between the actual forming position and the preset forming position of the film is in a compensable range, modifying the preset forming position of the film, according to the actual offset displacement between the actual forming position and the preset forming position of the film; and when the actual offset displacement between the actual forming position and the preset forming position of the film is not in the compensable range, and a difference value from a maximum compensation displacement corresponding to the compensable range is less than or equal to a threshold, modifying the preset forming position of the film, according to the maximum compensation displacement.

6. The method of claim 5, wherein the modifying the preset forming position of the film, according to the actual offset displacement between the actual forming position and the preset forming position of the film, comprises:

determining an offset displacement of a pixel definition layer, according to the actual offset displacement between the actual forming position and the preset forming position of the film, wherein the actual offset displacement between the actual forming position and the preset forming position of the film have a same corresponding distance and a same direction as the offset displacement of the pixel definition layer, and wherein the modifying the preset forming position of the film according to the maximum compensation displacement comprises:

determining the offset displacement of the pixel definition layer, according to the maximum compensation displacement, wherein the maximum compensation displacement has a same corresponding distance and a same direction as the offset displacement of the pixel definition layer.

7. The method of claim 5, wherein the modifying the preset forming position of the film, according to the actual offset displacement between the actual forming position and the preset forming position of the film, comprises:

determining an offset displacement of corresponding opening regions on the mask component, according to the actual offset displacement between the actual forming position and the preset forming position of the film, wherein the actual offset displacement between the actual forming position and the preset forming position of the film and the offset displacement of corresponding opening regions on the mask component have a same corresponding distance but opposite direction, and wherein the modifying the preset forming position of the film according to the maximum compensation displacement comprises:

determining the offset displacement of corresponding opening regions on the mask component according to the maximum compensation displacement, wherein the maximum compensation displacement and the offset displacement of corresponding opening regions on the mask component have a same corresponding distance but opposite direction.

8. A device for modifying film deposition position in a film deposition process with a mask component, wherein the mask component comprises a mask frame and a mask body fixed to the mask frame, the device comprising:

a first offset displacement obtainer, configured to obtain a first offset displacement between a plurality of second mark points on the mask component and a plurality of first mark points on the mask body;

a second offset displacement obtainer, configured to obtain a second offset displacement between a plurality of third mark points on a substrate and the plurality of second mark points on the mask component, wherein the plurality of third mark points are formed on the substrate by the plurality of second mark points when a film is evaporated on the substrate with the mask component;

an actual offset displacement determiner, configured to determine an actual offset displacement between an actual forming position and a preset forming position of the film, according to the first offset displacement and the second offset displacement; and a forming position modifier, configured to modify the preset forming position of the film, according to the actual offset displacement between the actual forming position and the preset forming position of the film.

9. The device of claim 8, wherein the first offset displacement obtainer comprises:

a first coordinate sub-obtainer, configured to obtain first coordinates of the plurality of first mark points on the mask body;

a second coordinate sub-measurer, configured to measure second coordinates of the plurality of second mark points on the mask component; and a first offset displacement sub-calculator, configured to subtract the first coordinates from the second coordinates, to obtain the first offset displacement between the plurality of second mark points on the mask component and the plurality of first mark points on mask body.

10. The device of claim 9, wherein the second offset displacement obtainer comprises:

a third coordinate sub-measurer, configured to measure third coordinates of the plurality of third mark points on the substrate; and a second offset displacement sub-calculator, configured to subtract the second coordinates from the third coordinates, to obtain the second offset displacement between the plurality of third mark points on the substrate and the plurality of second mark points on the mask component.

11. The device of claim 8, wherein the actual offset displacement determiner comprises:

a first actual offset displacement sub-calculator, configured to add the first offset displacement to the second offset displacement, to obtain an actual offset displacement of the plurality of third mark points;

a first ratio sub-calculator, configured to, for a first target mark point and a second target mark point of the plurality of third mark points, divide a difference value between the actual offset displacement of the second target mark point and the first target mark point by a number of actual forming positions of the film between the first target mark point and the second target mark point to obtain a first ratio; and a second actual offset displacement sub-calculator, configured to, for an Mth actual forming position of the film between the first target mark point and the second target mark point, add a product of M and the first ratio to actual offset displacement of the first target mark point, to obtain an Mth actual offset displacement between the actual forming position and the preset forming position of the film, M being a positive integer greater than 0.

12. The device of claim 8, wherein the forming position modifier comprises:

a first forming position sub-modifier, configured to, when the actual offset displacement between the actual forming position and the preset forming position of the film lies in a compensable range, modify the preset forming position of the film, according to the actual offset displacement between the actual forming position and the preset forming position of the film; and a second forming position sub-modifier, configured to, when the actual offset displacement between the actual forming position and the preset forming position of the film is not in the compensable range, and a difference value from a maximum compensation displacement corresponding to the compensable range is less than or equal to a threshold, modify the preset forming position of the film, according to the maximum compensation displacement.

13. The device of claim 12, wherein the first forming position sub-modifier comprises:

a first offset displacement determiner, configured to determine an offset displacement of a pixel definition layer, according to the actual offset displacement between the actual forming position and the preset forming position of the film, wherein the actual offset displacement between the actual forming position and the preset forming position of the film have a same corresponding distance and a same direction as the offset displacement of the pixel definition layer, and wherein the second forming position sub-modifier comprises:

a second offset displacement determiner, configured to determine the offset displacement of the pixel definition layer, according to the maximum compensation displacement, wherein the maximum compensation displacement has a same corresponding distance and a same direction as the offset displacement of the pixel definition layer.

14. The device of claim 12, wherein the first forming position sub-modifier comprises:

a third offset displacement determiner, configured to determine an offset displacement of corresponding opening regions on the mask component, according to the actual offset displacement between the actual forming position and the preset forming position of the film, wherein the actual offset displacement between the actual forming position and the preset forming position of the film and the offset displacement of corresponding opening regions on the mask component have a same corresponding distance but opposite direction, and wherein the second forming position sub-modifier comprises:

a fourth offset displacement determiner, configured to determine the offset displacement of corresponding opening regions on the mask component according to the maximum compensation displacement, wherein the maximum compensation displacement and the offset displacement of corresponding opening regions on the mask component have a same corresponding distance but opposite direction.

* * * * *